United States Patent
Isaak

(10) Patent No.: US 6,426,240 B2
(45) Date of Patent: Jul. 30, 2002

(54) STACKABLE FLEX CIRCUIT CHIP PACKAGE AND METHOD OF MAKING SAME

(76) Inventor: Harlan R. Isaak, 2870 Chios Rd., Costa Mesa, CA (US) 92626

(*) Notice: Subject to any disclaimer, the term of this patent is extended or adjusted under 35 U.S.C. 154(b) by 0 days.

(21) Appl. No.: 09/888,785

(22) Filed: Jun. 25, 2001

Related U.S. Application Data

(60) Division of application No. 09/574,321, filed on May 19, 2000, which is a continuation-in-part of application No. 09/305,584, filed on May 5, 1999.

(51) Int. Cl.[7] .......................... H01L 21/44; H01L 21/48; H01L 21/50

(52) U.S. Cl. ........................................ 438/106; 438/109

(58) Field of Search .............................. 438/51, 55, 64, 438/68, 106, 107, 108, 109, 110, 111, 113, 118

(56) References Cited

U.S. PATENT DOCUMENTS

| | | | |
|---|---|---|---|
| 4,956,694 A | 9/1990 | Eide | |
| 5,313,096 A | 5/1994 | Eide | |
| 5,612,570 A | * 3/1997 | Eide et al. | 257/666 |
| 6,323,060 B1 | * 11/2001 | Isaak | 438/109 |

* cited by examiner

*Primary Examiner*—Viet Q. Nguyen
*Assistant Examiner*—David Nhu
(74) *Attorney, Agent, or Firm*—Stetina Brunda Garred & Brucker

(57) ABSTRACT

A stackable integrated circuit chip package having a flex circuit. The flex circuit itself includes a flexible substrate having opposed, generally planar top and bottom surfaces, and a conductive pattern which is disposed on the bottom surface. The chip package further includes a frame which is attached to the substrate of the flex circuit, and an integrated circuit chip which is at least partially circumvented by the frame and electrically connected to the conductive pattern. The substrate is wrapped about and attached to at least a portion of the frame such that the conductive pattern defines first and second portions which are each electrically connectable to another stackable integrated circuit chip package.

30 Claims, 10 Drawing Sheets

STACKABLE FLEX CIRCUIT CHIP PACKAGE AND METHOD OF MAKING SAME

CROSS-REFERENCE TO RELATED APPLICATIONS

The present application is a division of application Ser. No. 09/574,321 filed May 19, 2000 which is a continuation-in-part of U.S. application Ser. No. 09/305,584 entitled STACKABLE FLEX CIRCUIT IC PACKAGE AND METHOD OF MAKING SAME filed May 5, 1999, the disclosure of which is incorporated herein by reference.

STATEMENT RE: FEDERALLY SPONSORED RESEARCH/DEVELOPMENT (Not Applicable)

FIELD OF THE INVENTION

The present invention relates generally to chip stacks, and more particularly to a stackable integrated circuit chip package including a flex circuit which allows multiple chip packages to be quickly, easily and inexpensively assembled into a chip stack having a minimal profile.

BACKGROUND OF THE INVENTION

Multiple techniques are currently employed in the prior art to increase memory capacity on a printed circuit board. Such techniques include the use of larger memory chips, if available, and increasing the size of the circuit board for purposes of allowing the same to accommodate more memory devices or chips. In another technique, vertical plug-in boards are used to increase the height of the circuit board to allow the same to accommodate additional memory devices or chips.

Perhaps one of the most commonly used techniques to increase memory capacity is the stacking of memory devices into a vertical chip stack, sometimes referred to as 3D packaging or Z-Stacking. In the Z-Stacking process, from two (2) to as many as eight (8) memory devices or other integrated circuit (IC) chips are interconnected in a single component (i.e., chip stack) which is mountable to the "footprint" typically used for a single package device such as a packaged chip. The Z-Stacking process has been found to be volumetrically efficient, with packaged chips in TSOP (thin small outline package) or LCC (leadless chip carrier) form generally being considered to be the easiest to use in relation thereto. Though bare dies or chips may also be used in the Z-Stacking process, such use tends to make the stacking process more complex and not well suited to automation.

In the Z-Stacking process, the IC chips or packaged chips must, in addition to being formed into a stack, be electrically interconnected to each other in a desired manner. There is known in the prior art various different arrangements and techniques for electrically interconnecting the IC chips or packaged chips within a stack. Examples of such arrangements and techniques are disclosed in Applicant's U.S. Pat. Nos. 4,956,694 entitled INTEGRATED CIRCUIT CHIP STACKING issued Sep. 11, 1990, 5,612,570 entitled CHIP STACK AND METHOD OF MAKING SAME issued Mar. 18, 1997, and 5,869,353 entitled MODULAR PANEL STACKING PROCESS issued Feb. 9, 1999.

The various arrangements and techniques described in these issued patents and other currently pending patent applications of Applicant have been found to provide chip stacks which are relatively easy and inexpensive to manufacture, and are well suited for use in a multitude of differing applications. The present invention provides yet a further alternative arrangement and technique for forming a chip stack which involves the use of stackable integrated circuit chip packages including flex circuits. The inclusion of the flex circuits in the chip packages of the present invention provides numerous advantages in the assembly of the chip stack, including significant increases in the production rate and resultant reductions in cost attributable to the reduced complexity of the assembly process.

SUMMARY OF THE INVENTION

In accordance with a first embodiment of the present invention, there is provided a stackable integrated circuit chip package which comprises a flex circuit. The flex circuit itself comprises a flexible substrate having opposed, generally planar top and bottom surfaces. Disposed on the flex circuit is a conductive pattern. In addition to the flex circuit, the chip package comprises a frame which is attached to the substrate of the flex circuit. Also included in the chip package is an integrated circuit chip which is at least partially circumvented by the frame and electrically connected to the conductive pattern. The substrate is wrapped about and attached to at least a portion of the frame such that the conductive pattern defines first and second portions which are each electrically connectable to another stackable integrated circuit ship package.

In the first embodiment, the frame preferably has a generally rectangular configuration defining opposed pairs of longitudinal and lateral sides. The frame also defines a central opening for receiving the integrated circuit chip, with the top and bottom surfaces of the frame being attached to the top surface of the substrate. The substrate is preferably wrapped about the frame such that the first portion of the conductive pattern extends over a portion of the bottom surface of the frame, with the second portion of the conductive pattern extending over a portion of the top surface of the frame. More particularly, the substrate is wrapped about the longitudinal sides of the frame such that the first and second portions of the conductive pattern extend in spaced, generally parallel relation to each other over respective portions of the bottom and top surfaces of the frame.

The substrate itself preferably has a generally rectangular configuration defining a pair of longitudinal peripheral edge segments and a pair of lateral peripheral edge segments. The conductive pattern extends along the bottom surface of the substrate to the longitudinal peripheral edge segments thereof, with the substrate preferably being wrapped about the longitudinal sides of the frame such that the longitudinal peripheral edge segments of the substrate extend along respective ones of the longitudinal sides of the frame. The substrate is also sized relative to the frame such that the lateral sides of the frame protrude from respective ones of the lateral peripheral edge segments of the substrate, with the longitudinal peripheral edge segments of the substrate also extending to the central opening of the frame. In the chip package of the first embodiment, a pair of heat sinks may be attached to one or both of the lateral sides of the frame which extend beyond the lateral peripheral edge segments of the substrate.

The conductive pattern of the chip package of the first embodiment preferably comprises a first set of pads which are disposed on the bottom surface of the substrate, and a second set of pads which are disposed on the top surface of the substrate and electrically connected to respective ones of the pads of the first set. The integrated circuit chip is itself electrically connected to the pads of the second set. A plurality of copper bumps or solder bumps may be formed on respective ones of the pads of the first set for facilitating the electrical connection of the chip package to a mother board. The pads of the second set are preferably arranged in an identical pattern to those of the first set such that the pads of the second set are aligned with and electrically connected to respective ones of the pads of the first set. The electrical connection of the pads of the first and second sets to each other is preferably accomplished through the use of vias which are formed in the substrate and extend between respective aligned pairs of the pads of the first and second sets.

The integrated circuit chip of the chip package of the first embodiment preferably comprises a body having opposed, generally planar top and bottom surfaces. In addition to the body, the integrated circuit chip includes a plurality of conductive contacts which are disposed on the bottom surface of the body. The conductive contacts of the integrated circuit chip are electrically connected to respective ones of the pads of the second set. The conductive contacts are preferably arranged on the bottom surface of the body in an identical pattern to the pads of the second set, and are preferably electrically connected to respective ones of the pads of the second set via solder. The integrated circuit chip is preferably selected from the group consisting of a flip chip device and a fine pitch BGA device.

In the chip package of the first embodiment, a layer of epoxy is preferably disposed between the bottom surface of the body and the top surface of the substrate. Additionally, the substrate is preferably attached to the frame through the use of an acrylic film adhesive. The substrate is preferably fabricated from a polyamide having a thickness in the range of from about 1 mil to about 8 mils, with the frame preferably being fabricated from either a plastic material filled with a thermal enhancing material or a metal material. The chip package may be combined with a second chip package stacked upon the chip package, with the first portion of the conductive pattern of the second chip package being electrically connected to the second portion of the conductive pattern of the chip package. The electrical connection of the chip packages to each other is preferably accomplished through the use of a Z-axis film material or adhesive.

In accordance with a second embodiment of the present invention, there is provided a stackable integrated circuit chip package comprising a flex circuit. In the second embodiment, the flex circuit itself comprises a flexible substrate having opposed, generally planar top and bottom surfaces, and a conductive pattern which is disposed on the flex circuit. The chip package of the second embodiment also includes an integrated circuit chip which is electrically connected to the conductive pattern. The substrate of the chip package of the second embodiment is wrapped about and attached to at least a portion of the integrated circuit chip such that the conductive pattern defines first and second portions which are each electrically connectable to another stackable integrated circuit chip package. In the chip package of the second embodiment, the conductive pattern comprises the first and second sets of pads as described in relation to the chip package of the first embodiment. The electrical connection of the integrated circuit chip to the conductive pattern is accomplished in the chip package of the second embodiment in the same manner previously described in relation to the chip package of the first embodiment.

In the chip package of the second embodiment, the body of the integrated circuit chip preferably has a generally rectangular configuration defining a pair of longitudinal sides and a pair of lateral sides. The substrate itself preferably has a generally rectangular configuration defining a pair of longitudinal peripheral edge segments and a pair of lateral peripheral edge segments. The conductive pattern extends along the bottom surface of the substrate to the longitudinal peripheral edge segments thereof. The substrate is wrapped about the longitudinal sides of the body, such that the longitudinal peripheral edge segments of the substrate extend along the top surface of the body in spaced, generally parallel relation to each other. The first and second portions of the conductive pattern also extend in spaced, generally parallel relation to each other over respective portions of the bottom and top surfaces of the body of the integrated circuit chip. The substrate is preferably attached to the integrated circuit chip through the use of an acrylic film adhesive. Additionally, a layer of epoxy is preferably disposed between the bottom surface of the body and top surface of the substrate. The substrate of the chip package of the second embodiment is preferably fabricated from the same material having the same thickness range as previously described in relation to the chip package of the first embodiment.

In accordance with a third embodiment of the present invention, there is provided a stackable integrated circuit chip package comprising a flex circuit. The flex circuit itself comprises a flexible substrate having opposed, generally planar top and bottom surfaces, and a conductive pattern which is disposed thereon. The chip package of the third embodiment further comprises an integrated circuit chip which is electrically connected to the conductive pattern. The substrate is folded and attached to itself such that the conductive pattern defines first and second portions which are each electrically connectable to another stackable integrated circuit chip package. In the chip package of the third embodiment, the conductive pattern comprises the first and second sets of pads as described in relation to the chip package of the first embodiment. Additionally, the electrical connection of the integrated circuit chip to the conductive pattern is preferably accomplished in the same manner as previously described in relation to the chip package of the first embodiment.

In the chip package of the third embodiment, the body of the integrated circuit chip preferably has a generally rectangular configuration defining a pair of longitudinal sides and a pair of lateral sides. The substrate itself preferably has a generally rectangular configuration defining a pair of longitudinal peripheral edge segments and a pair of lateral peripheral edge segments. The conductive pattern extends along the bottom surface of the substrate to the longitudinal peripheral edge segments thereof. The substrate is folded such that the longitudinal peripheral edge segments thereof extend along and in substantially parallel relation to respective ones of the longitudinal sides of the body, with the first and second portions of the conductive pattern extending in generally parallel relation to each other. As will be recognized, the total thickness of the substrate at those regions whereat it is folded over itself is preferably such that the second portion of the conductive pattern is substantially flush with or extends along a plane disposed above the top surface of the body of the integrated circuit chip, thus allowing for the electrical connection of the second portion of the conductive pattern of the chip package to another stackable integrated circuit chip package. In the chip package of the third embodiment, the substrate is preferably attached to itself through the use of an acrylic film adhesive, with the chip package further preferably comprising a layer of epoxy disposed between the bottom surface of the body and the top surface of the substrate. The substrate in the chip package of the third embodiment is also preferably fabricated from the same material in the same thickness range as previously described in relation to the chip package of the first embodiment.

Further in accordance with the present invention, there is provided a method of assembling a stackable integrated circuit chip package constructed in accordance with the first embodiment of the present invention. The method comprises the initial step of electrically connecting an integrated circuit chip to a conductive pattern on a flexible substrate of a flex circuit. This particular step is itself preferably accomplished by first applying a layer of flux to the conductive contacts of the integrated circuit chip, and thereafter positioning the integrated circuit chip upon the substrate such that at least some of conductive contacts abut the conductive pattern. Thereafter, heat is applied to the integrated circuit chip and the substrate to facilitate the reflow of the solder disposed on the conductive contacts and electrical connection thereof to the conductive pattern.

In the preferred method, the above described initial heat application step is followed by the dispensation of a quantity of an epoxy onto the substrate along a side of the integrated circuit chip to facilitate the wicking of the epoxy between the integrated circuit chip and the substrate. At this time, the substrate preferably resides on a heated stage at a temperature of about 90 degrees Celsius. After the epoxy has been applied to the substrate, the heat applied to the integrated circuit chip and the substrate by the heated stage is then increased to a temperature of about 160 degrees Celsius for a time period of about 5 minutes to facilitate the hardening of the epoxy. The epoxy dispensation and subsequent heating step are preferably completed while a vacuum is being applied to the substrate to maintain the substrate in a generally flat orientation. Thereafter, the integrity of electrical connection of the conductive contacts of the integrated circuit chip to the conductive pattern is tested.

Upon the completion of the electrical connection of the integrated circuit chip to the conductive pattern, a frame is attached to the flex circuit such that the frame at least partially circumvents the integrated circuit chip. The attachment of the frame to the flex circuit is preferably accomplished by initially bonding two strips of an adhesive to the substrate along opposite sides of the integrated circuit chip. Thereafter, a pair of flex windows are punched through the substrate and respective ones of the adhesive strips, with the frame thereafter being attached to the adhesive strips. The bonding of the adhesive strips to the substrate is preferably completed by heating the adhesive strips and the substrate to a temperature of about 140 degrees Celsius and applying pressure to the adhesive strips for a time period of from about 5 seconds to about 10 seconds. To facilitate the attachment of the frame to the adhesive strips, the frame, adhesive strips, and substrate are preferably heated to a temperature of about 130 degrees Celsius, with pressure of about 20 psi being applied to the frame for a time period of about 5 seconds.

Following the attachment of the frame to the flex circuit, the flex circuit is wrapped about and secured to at least a portion of the frame such that the conductive pattern defines first and second portions which are each electrically connectable to at least one other stackable integrated circuit chip package. To facilitate such wrapping, the substrate is preferably positioned upon a spaced pair of reciprocally movable wrapping fingers, with pressure then being applied to one side of the frame of the integrated circuit chip to force the frame and the integrated circuit chip between the wrapping fingers and facilitate the folding of the substrate upwardly along each of the opposed sides of the frame. The wrapping fingers are then moved toward each other to facilitate the wrapping of the substrate about the opposed sides of the frame. Heat is applied to the chip package at a temperature about 180 degrees Celsius for a time period of about 5 minutes after the movement of the wrapping fingers toward each other. This 5 minute time period is used to facilitate the curing of the adhesive, with the wrapping fingers being moved away from each other upon the elapse thereof to allow for the removal of the chip package from therebetween.

The present method may further comprise the additional step of electrically connecting the second portion of the conductive pattern of the chip package to the first portion of the conductive pattern of another stackable integrated circuit chip package to form a chip stack. Such electrical connection between the chip packages is preferably accomplished by first placing a Z-axis film between the first and second portions of the conductive patterns of the chip packages, and thereafter applying heat and pressure to the chip packages for a time period of about 1 minute to cure the Z-axis film. A plurality of copper bumps or solder bumps may then be formed on the first portion of the conductive pattern of the lowermost chip package of the chip stack, with the integrity of the electrical connection of the chip packages to each other than being tested.

Further in accordance with the present invention, there is provided methods for assembling chip packages constructed in accordance with the second and third embodiments as described above. These assembly methods are substantially similar to assembly method previously described in relation to the chip package of the first embodiment. More particularly, the assembly method related to the chip package of the second embodiment differs only in that the substrate is wrapped about opposed sides of the integrated circuit chip and adhered directly thereto due to the absence of the frame in the chip package of the second embodiment. In the assembly method related to the third embodiment, the substrate is folded over and adhered to itself.

DETAILED DESCRIPTION OF THE INVENTION

Figures 1, 2:
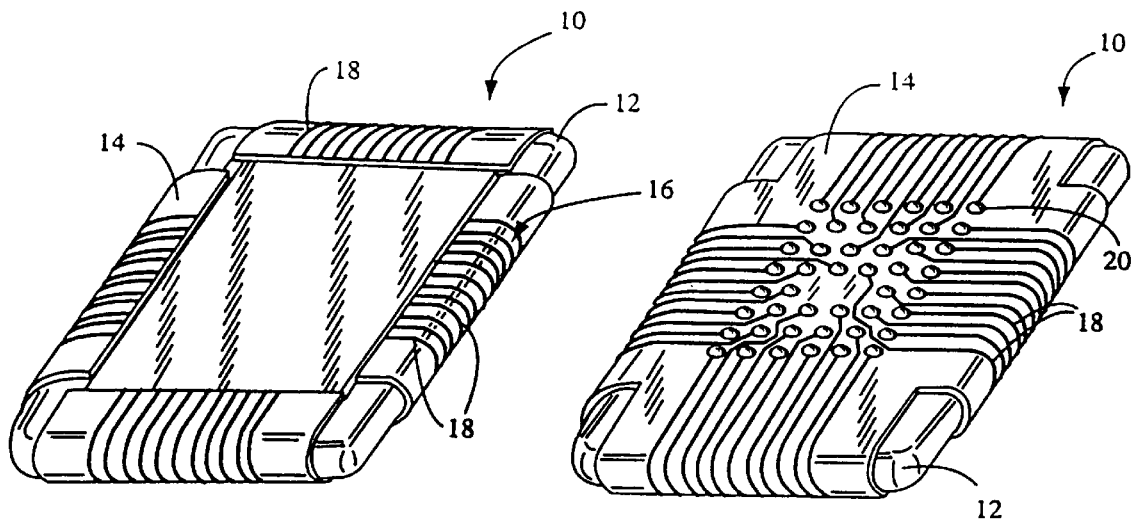
FIG. 1 is a top perspective view of a four-sided flex circuit chip package constructed in accordance with the teachings of parent application Ser. No. 09/305,584.
FIG. 2 is a bottom perspective view of the four-sided flex circuit chip package shown in FIG. 1.

Referring now to the drawings wherein the showings are for purposes of illustrating preferred embodiments of the present invention only, and not for purposes of limiting the same, FIGS. 1 and 2 perspectively illustrate a four-sided flex circuit chip package 10 constructed in accordance with the teachings of parent application Ser. No. 09/305,584 entitled STACKABLE FLEX CIRCUIT IC PACKAGE AND METHOD OF MAKING SAME filed May 5, 1999 of which the present application is a continuation-in-part. In the chip package 10, all four sides of the frame 12 thereof are wrapped by respective portions of the flex circuit 14 of the chip package 10. The need to wrap all four sides of the frame 12 with the flex circuit 14 requires a relatively high level of handling, thus increasing production time and hence cost. In the chip package 10, the conductive pattern 16 of the flex circuit 14 comprises a plurality of conductive traces 18 which each extend to a respective conductive pad 20 on the bottom surface of the flex circuit 14. These conductive traces 20 are segregated into four different sets, with the conductive traces 20 of each set typically being of a 10–20 mil pitch.

Figures 3, 4:
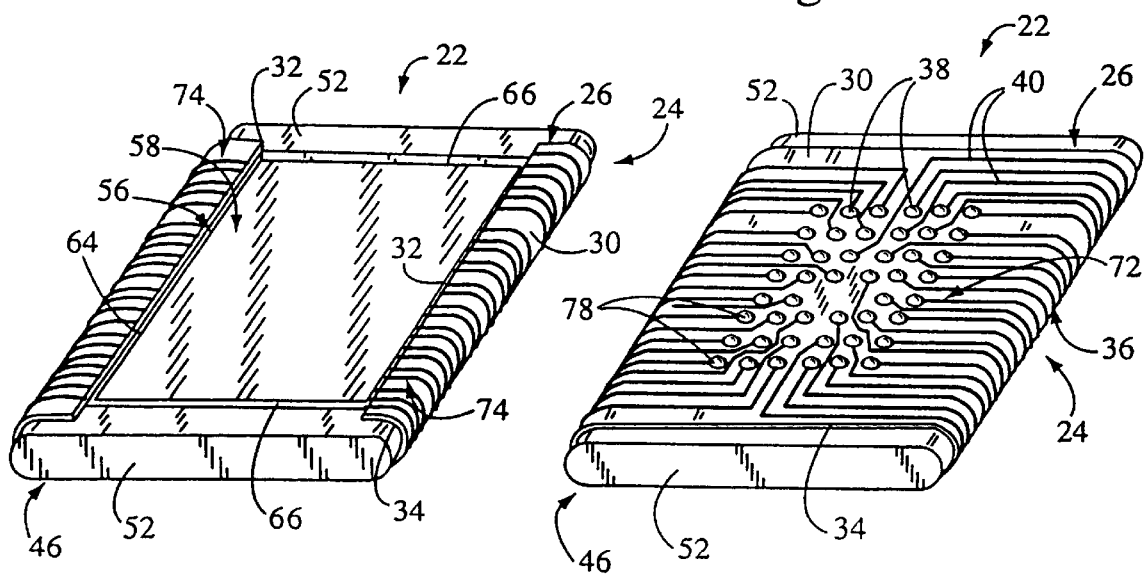
FIG. 3 is a top perspective view of a two-sided flex circuit chip package constructed in accordance with a first embodiment of the present invention.
FIG. 4 is a bottom perspective view of the chip package shown in FIG. 3.
Figure 5:
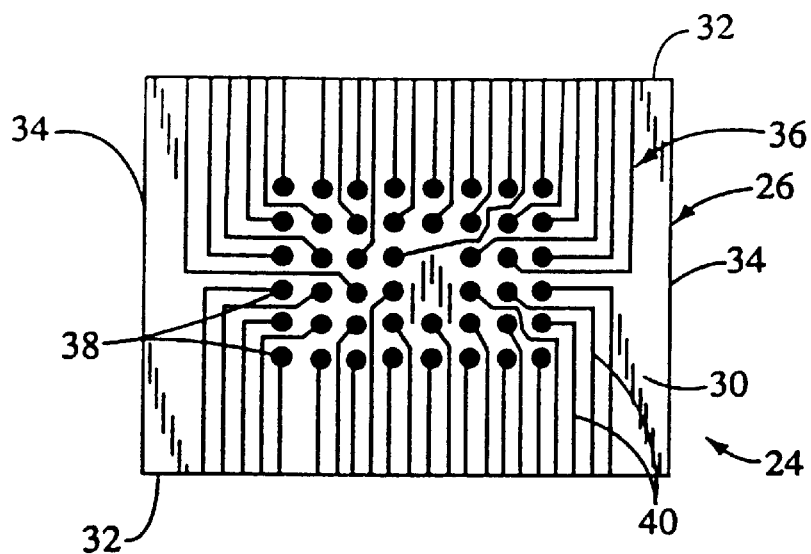
FIG. 5 is a bottom plan view of the flex circuit of the chip package of the first embodiment shown in FIGS. 3 and 4.

Referring now to FIGS. 3 and 4, there is perspectively illustrated a two-sided flex circuit chip package 22 constructed in accordance with a first embodiment of the present invention. As seen in FIGS. 3–5, the chip package 22 comprises a flex circuit 24 which itself comprises a flexible substrate 26 having a generally planar top surface 28 (shown in FIGS. 6 and 7) and a generally planar bottom surface 30. The substrate 26 preferably has a generally rectangular configuration defining a pair of longitudinal peripheral edge segments 32 and a pair of lateral peripheral edge segments 34. The substrate 26 is preferably fabricated from a polyamide which has a thickness of several mils or less, and may have a thickness down to about 1 mil.

Disposed on the substrate 26 is a conductive pattern 36 of the flex circuit 24. The conductive pattern 36 comprises a first set of conductive pads 38 which are disposed on the bottom surface 30 of the substrate 26. In addition to the pads 38 of the first set, the conductive pattern 36 comprises a plurality of conductive traces 40 which extend along the bottom surface 30 of the substrate 26 from respective ones of the pads 38 of the first set to respective ones of the longitudinal peripheral edge segments 32 of the substrate 26. As best seen in FIG. 5, the traces 40 are segregated into two sets, with the traces 40 of each set preferably being separated by a pitch of 10 to 15 mils. Importantly, the pitch between the conductive traces 40 of each set is such that the traces 40 may be extended to only the longitudinal peripheral edge segments 32 of the substrate 26, and not to the lateral peripheral edge segments 34 thereof. Thus, in the chip package 22, only two sets of traces 40 are included, as opposed to the four sets of traces 18 included in the conductive pattern 16 of the flex circuit 14 of the chip package 10 shown in FIGS. 1 and 2. As will be discussed in more detail below, the extension of the traces 40 to only the longitudinal peripheral edge segments 32 of the substrate 26 substantially reduces the complexity, and hence the cost of the assembly method related to the chip package 22, as well as chip stacks including multiple chip packages 22.

As will also be discussed below, this "two-sided" approach for the chip package 22 allows for various cooling options which are not practical for a "four-sided" approach.

In addition to the pads 38 of the first set and the traces 40, the conductive pattern 36 of the flex circuit 24 comprises a second set of conductive pads 42 which are disposed on the top surface 28 of the substrate 26 and electrically connected to respective ones of the pads 38 of the first set. In the chip package 22, the pads 42 of the second set are arranged in an identical pattern to the pads 38 of the first set such that the pads 42 of the second set are aligned with and electrically connected to respective ones of the pads 38 of the first set. As best seen in 30 FIGS. 6 and 7, the electrical connection of the pads 38, 42 of the first and second sets to each other is preferably accomplished through the use of vias 44 which are formed in the substrate 26 and extend between respective aligned pairs of the pads 38, 42 of the first and second sets.

The pads 38, 42 of the first and second sets and traces 40 are preferably fabricated from very thin copper having a thickness in the range of from about 5 microns to about 25 microns through the use of conventional etching techniques. Advantageously, the use of thin copper for the pads 38, 42 and traces 40 allows for etching line widths and spacings down to a pitch of about 4 mils which substantially increases the routing density on the flex circuit 24 and, as indicated above, allows for the two-sided approach. As also indicated above, the pads 38, 42 and traces 40 collectively define the conductive pattern 36 of the flex circuit 24.

Referring now to FIGS. 3, 4, 6 and 7, the chip package 22 constructed in accordance with the first embodiment of the present invention further comprises a frame 46 which is attached to the substrate 26 of the flex circuit 24 through the use of two strips 48 of an adhesive in a manner which will be described in more detail below. In the chip package 22, the frame 46 preferably has a generally rectangular configuration defining an opposed pair of longitudinal sides 50 and an opposed pair of lateral sides 52. The longitudinal and lateral sides 50, 52 of the frame 46 collectively define a rectangularly configured central opening 54 thereof. As will also be discussed in more detail below, the frame 46 defines top and bottom surfaces, portions of which are attached to the top surface 28 of the substrate 26 via the adhesive strips 48 when the chip package 22 is properly assembled.

A preferred adhesive for the adhesive strips 48 is an acrylic film adhesive sold by DuPont and available as Pyralux LF which is a non-tacky film at room temperature and becomes tacky at 140 degrees Celsius. This particular acrylic film adhesive punches well, bonds well, withstands solder reflow temperatures, and is commonly used for circuit board lamination. In the first embodiment, the frame 46 is preferably fabricated from either a plastic material filled with a thermal enhancing material, or a metal material made using powder metallurgy. The use of these particular materials provides the frame 46 with thermally conductive properties which are useful for heat dissipation, and thus are preferred to address thermal issues where heat must be removed from the chip stack assembled using the chip packages 22.

The chip package 22 of the first embodiment further comprises an integrated circuit chip 56 which is preferably a fine pitch BGA (ball grid array) device, but may alternatively comprise a flip chip device. In the chip package 22, the integrated circuit chip 56 is electrically connected to the pads 42 of the second set, and hence to the pads 38 of the first set by virtue of their electrical connection to the pads 42 of the second set. The integrated circuit chip 56 includes a rectangularly configured body 58 defining a generally planar top surface 60, a generally planar bottom surface 62, a pair of longitudinal sides 64 and a pair of lateral sides 66. Protruding from the bottom surface 62 of the body 58 are a plurality of generally semi-spherically shaped conductive contacts 68 which normally have a quantity of solder preapplied thereto. The conductive contacts 68 are preferably arranged in an identical pattern to each of the first and second sets of conductive pads 38, 42, with the conductive contacts 68 being electrically connected to respective ones of the pads 42 of the second set.

Figures 6, 7:
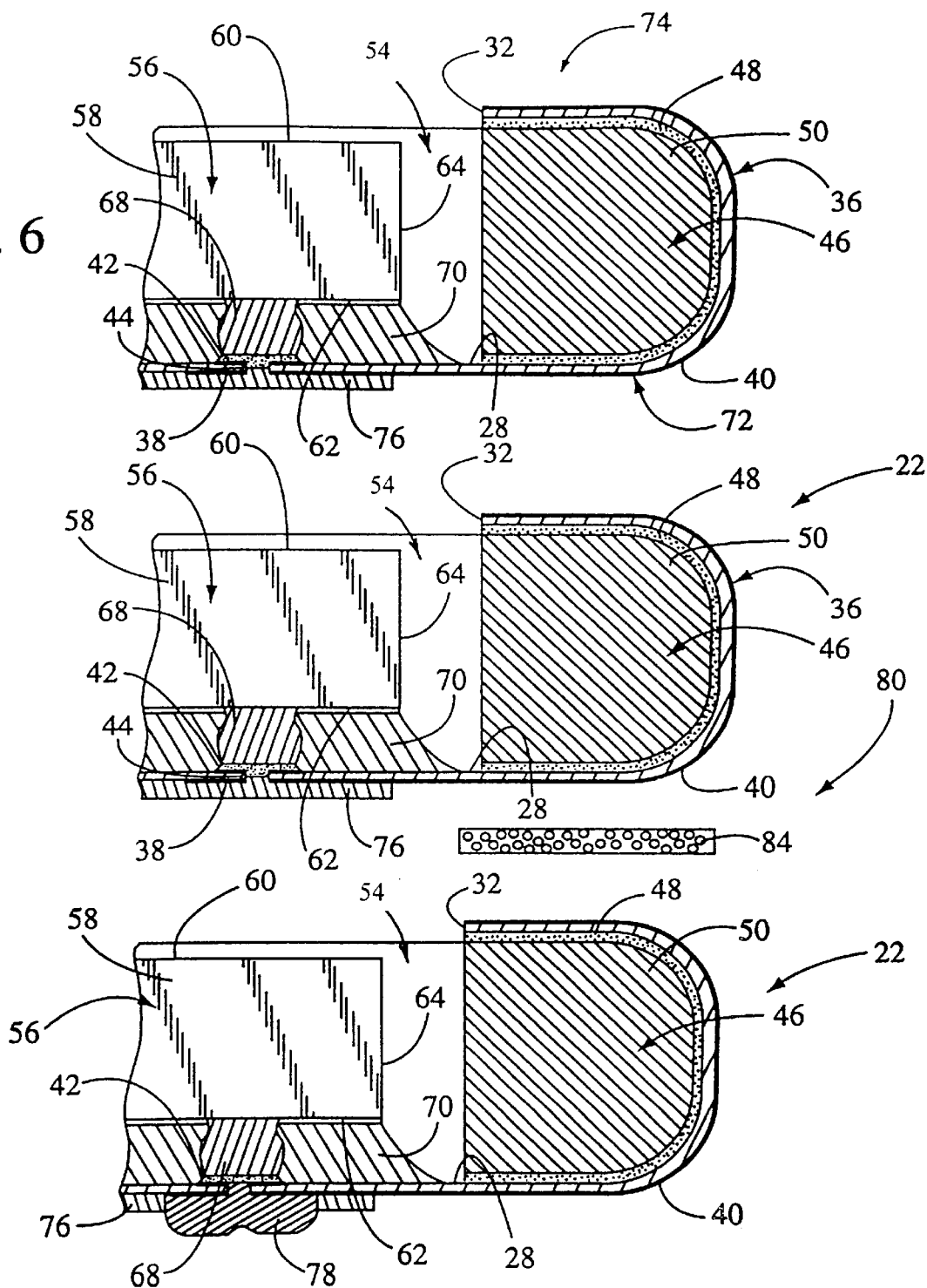
FIG. 6 is a partial cross-sectional view of the chip package of the first embodiment shown in FIG. 3.
FIG. 7 is an exploded, partial cross-sectional view of a chip stack comprising chip packages constructed in accordance with the first embodiment, further illustrating a copper bump formed on the conductive pattern of the flex circuit of the lowermost chip package.

In the chip package 22, the electrical connection of the conductive contacts 68 to respective ones of the pads 42 of the second set is preferably accomplished through the use of solder. More particularly, as will be discussed in more detail below, the solder pre-applied to the conductive contacts 68 is heated to a temperature which facilitates its reflow, thus facilitating the electrical connection of the conductive contacts 68 and pads 42 of the second set to each other. As is also seen in FIGS. 6 and 7, the chip package 22 further comprises a layer 70 of underfill epoxy which is disposed between the bottom surface 62 of the body 58 of the integrated circuit chip 56 and the top surface 28 of the substrate 26. A preferred epoxy is available from Dexter Hysol as No. FP4527. This particular epoxy material has been found to dispense and flow very well, and can be cured in stages.

In the chip package 22 of the first embodiment, the substrate 26 is wrapped about and attached to the frame 46 such that the conductive pattern 36 defines a lower, first portion 72 and an upper, second portion 74 which are each electrically connectable to another stackable integrated circuit chip package. More particularly, the substrate 26 is wrapped about the longitudinal sides 50 of the frame 46 such that the first and second portions 72, 74 of the conductive pattern 36 extend in spaced, generally parallel relation to each other, with the first portion 72 extending over portions of the bottom surface of the frame 46 and the second portion 74 extending over portions of the top surface of the frame 46. The substrate 26 is preferably sized relative to the frame 46 such that the longitudinal peripheral edge segments 32, which extend along respective ones of the longitudinal sides 50 of the frame, extend to or terminate at approximately the central opening 54, with the lateral sides 52 of the frame 46 extending or protruding from respective ones of the lateral peripheral edge segments 34 of the substrate 26.

As will be explained in more detail below, each of the adhesive strips 48 which is attached to the top surface 28 of the substrate 26 has a length substantially equal to the length of each longitudinal side 50 of the frame 46, and a width which is about three times the width of each longitudinal side 50 of the frame 46. Thus, when the bottom surfaces of the longitudinal sides 50 of the frame 46 are attached to respective ones of the adhesive strips 48, the inner longitudinal edges of such adhesive strips 48 preferably terminate at the central opening 54, with the outer longitudinal edges of the adhesive strips 48 extending outwardly beyond respective ones of the longitudinal sides 50 of the frame 46. Thus, as is seen in FIGS. 6 and 7, when the substrate 26 is wrapped about the longitudinal sides 50 of the frame 46, the preferred sizing of the adhesive strips 48 causes the outer edges thereof to also terminate at approximately the central opening 54, with each of the adhesive strips 48 extending between the substrate 26 and the top and bottom surfaces of a respective longitudinal side 50 of the frame 46.

As is further seen in FIG. 6, a solder mask 76 may be applied to each of the pads 38 of the first set prior to the electrical connection of the conductive contacts 68 to respective ones of the pads 42 of the second set. In this respect, when the integrated circuit chip 56 is heated to facilitate the reflow of the solder pre-applied to the conductive contacts 68, such solder sometimes has a tendency to wick through the vias 44, thus resulting in an insufficient soldered interconnection between the conductive contacts 68 and the pads 42 of the second set. As will be recognized, the inclusion of the solder mask 76 on each of the pads 38 of the first set substantially blocks or caps the open bottom end of each of the vias 44, thus preventing such wicking from occurring. Additionally, as seen in FIG. 7, in the chip package 22, a copper bump 78 may be formed on each of the pads 38 of the first set. As will be discussed below, the copper or solder bumps 78 will typically be included on the lowermost chip package 22 of a chip stack to facilitate the electrical connection of such lowermost chip package 22 to another electrical component such as, for example, a mother board.

Figure 8:
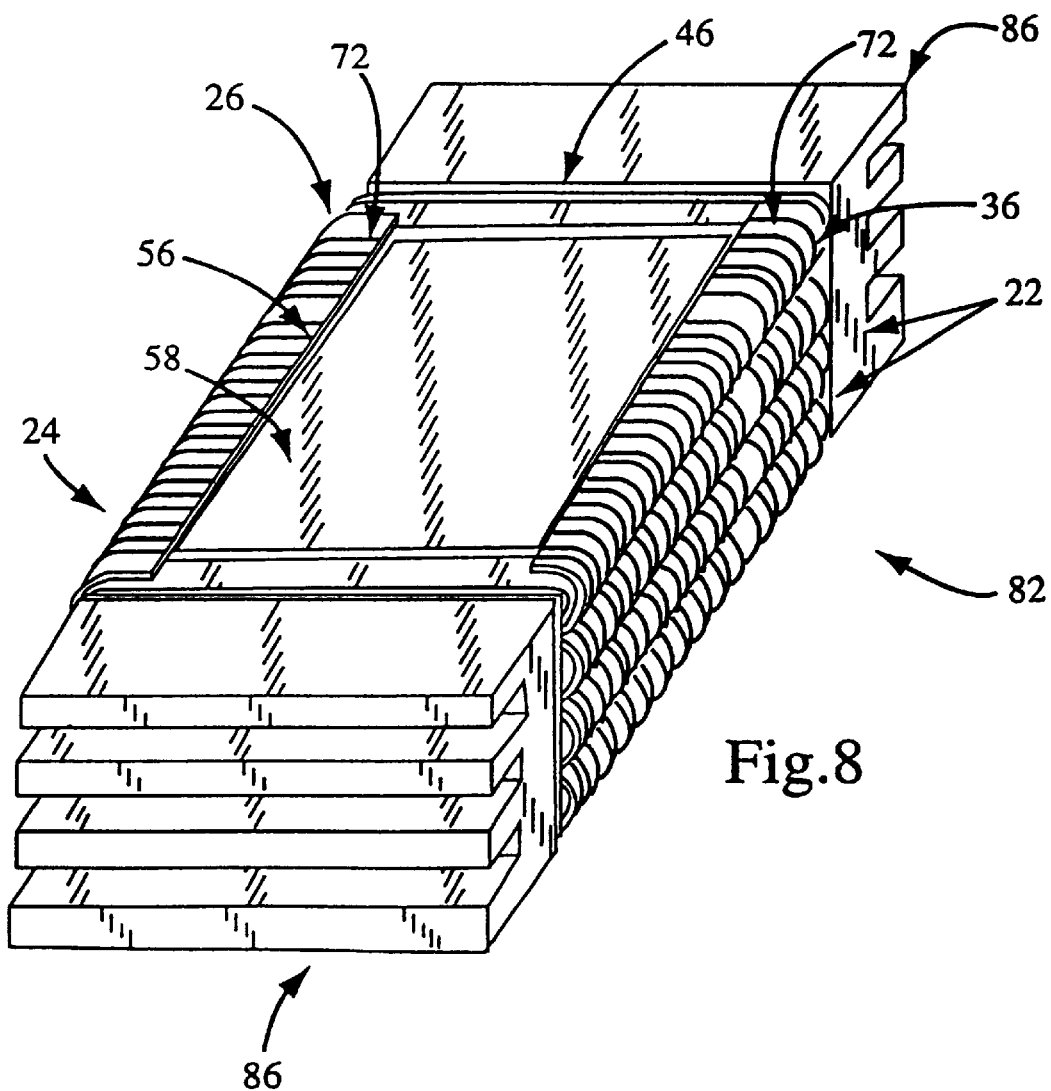
FIG. 8 is a top perspective view of a chip stack assembled using chip packages constructed in accordance with the first embodiment, further illustrating a pair of heat sinks attached to respective ones of the lateral ends of the frames of the chip packages within the chip stack.

FIG. 7 is an exploded view of a chip stack 80 including two chip stacks 22 of the first embodiment of the present invention. FIG. 8 depicts a chip stack 82 including four chip packages 22 of the first embodiment. It will be recognized that a chip stack may also be constructed to include three or more than four chip packages 22. As indicated above, the lowermost chip package 22 in the chip stack 80, 82 will typically include the copper or solder bumps 78 formed on respective ones of the pads 38 of the first set thereof. In the stack 80, 82, the chip packages 22 are arranged such that the first portion 72 of the conductive pattern 36 of any chip package 22 in the stack will be electrically connected to the second portion 74 of the conductive pattern 36 of the chip package 22 immediately therebelow. It will be recognized that the first portion 72 of the conductive pattern 36 of the lowermost chip package 22 will not be electrically connected to the second portion 74 of the conductive pattern 36 of another chip package 22, but rather will be electrically connected to a component such as a mother board through the use of the copper or solder bumps 78.

As is seen in FIG. 7, the attachment of any two chip packages 22 in the chip stack 80, 82 to each other is preferably accomplished through the use of a Z-axis epoxy or film 84 which will normally be applied to the second portion 74 of the conductive pattern 36. Since the second portion 74 of each conductive pattern 36 is segregated into two sections which extend along portions of the top surface of the frame 46 over respective ones of the longitudinal sides 50 thereof, the Z-axis film 84 is applied to the second portion 74 in two strips or sheets. A preferred Z-axis film material is available from the 3M Company as No. 5460. This particular film material contains gold-plated nickel particles of about 7 microns in size, with heat and pressure causing metal contact between the second portion 74 of the conductive pattern 36 of one chip package 22 to the first portion 72 of the conductive pattern 36 of another chip package 22 in the chip stack 80, 82 via the metal particles. Subsequent high temperature processes will typically form metallurgical bonds between the first and second portions 72, 74 and the intermediate gold-plated nickel particles within the Z-axis film 84.

Figure 9:
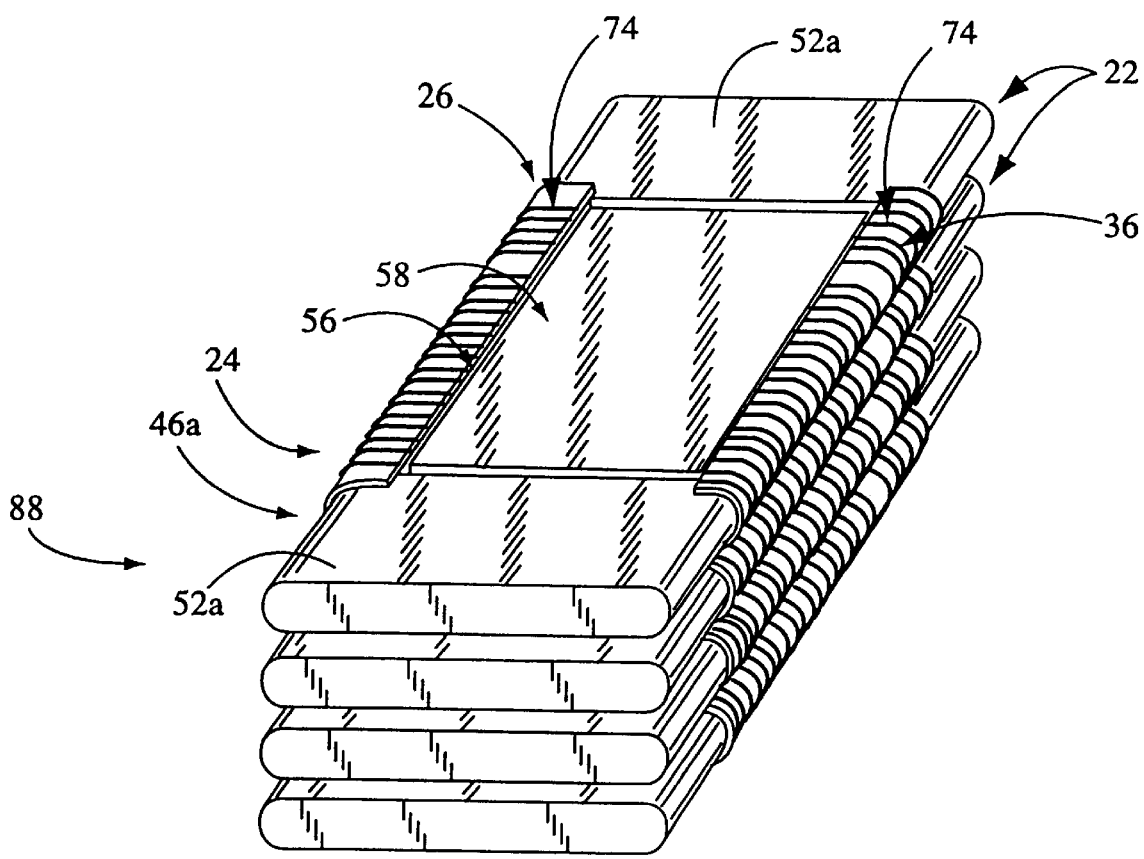
FIG. 9 is a top perspective view of a chip stack wherein the chip packages thereof include alternatively configured, extended frames.
Figure 10:
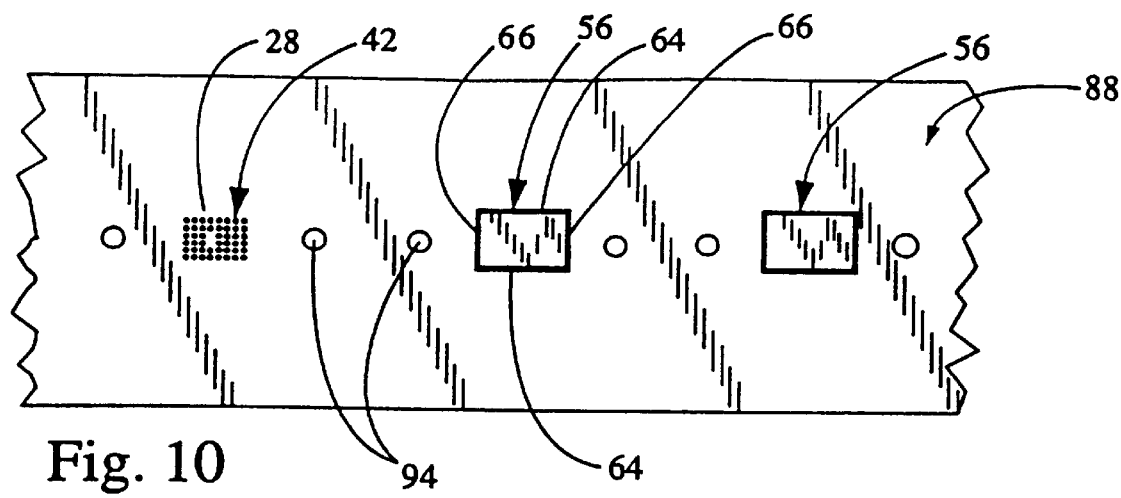
FIGS. 10–15 illustrate the sequence of steps implemented to facilitate the assembly of the chip package of the first embodiment of the present invention.

Referring again to FIG. 8, once the chip stack 82 has been assembled, a pair of heat sinks 86 may be attached to respective ones of the lateral sides 52 of each of the frames 46 of the chip packages 22 within the chip stack 82. As will be recognized, the heat sinks 86 assist in dissipating heat generated by the integrated circuit chips 56 within the chip stack 82. Though not shown, it will be recognized that one or both of the lateral sides 52 of each frame 46 may include a separate heat sink attached thereto. As an alternative to the heat sinks 86, FIG. 9 illustrates a chip stack 88 similar to the chip stack 82 but wherein the frames 46(a) of the chip packages 22 are slightly modified from the frames 46 such that the lateral sides 52(a) thereof protrude outwardly from the lateral peripheral edge segments 34 of the substrate 26 further than do the lateral sides 52 of the frame 46. These extended width lateral sides 52(a) of the frame 46(a) serve as heat sinks. The ability of the lateral sides 52(a) to serve as heat sink is, in part, facilitated by the preferred fabrication of the frame 46(a) from either a plastic material filled with a thermal enhancing material or a metal material as discussed above.

Having thus described the preferred configuration of the chip package 22 of the first embodiment and the chip stack 80, a preferred method of assembling each chip package 22 and a chip stack including two or more chip packages 22 will now be described with particular reference to FIGS. 10–16.

The preferred assembly method related to the chip package 22 preferably occurs in a continuous tape format, thus substantially increasing production flow. The assembly method or process as described below is capable of being set-up with universal tooling that can be adjusted for different dimensions without making new tooling. The assembly process is initiated with a continuous tape or strip 88 which, when punched and cut in the manner described below, will form the flex circuit 24 of each completed chip package 22. Thus, the strip 88 is preferably fabricated from the polyamide material in the aforementioned thickness range, with second sets of the conductive pads 42 being disposed on the top surface thereof in aligned, spaced relation to each other. Though not shown in FIG. 10, first sets of conductive pads 38 and conductive traces 40 corresponding to each second set of pads 42 are disposed on the bottom surface of the strip 88, thus facilitating the formation of equidistantly spaced conductive patterns 36 on the strip 88.

In the preferred assembly method, an integrated circuit chip 56 is picked and placed upon respective ones of the second sets of conductive pads 42 such that each of the conductive contacts 68 of a particular integrated circuit chip 56 abut respective ones of the pads 42 of the corresponding second set. Prior to such placement, the conductive contacts 68 of each integrated circuit chip 56 preferably have a layer of tacky flux applied thereto, with such application preferably being accomplished by dipping the conductive contacts 68 into a thin layer of flux doctor bladed over a flat surface. It will be recognized that many pick and place machines are capable of completing such dipping operation. As indicated above, the conductive contacts 68 of each integrated circuit chip 56 already have solder applied thereto. As also indicated above, subsequent to the flux application, each integrated circuit chip 56 is placed or positioned upon the strip 88 in the above-described manner.

The strip 88 having the integrated circuit chip 56 positioned thereon continues through a heated zone which provides the proper atmosphere and a profile suitable for the flux applied to the conductive contacts 68. In this heated zone, a peak temperature of about 220 degrees Celsius is used to reflow the solder disposed upon the conductive contacts 68, thus facilitating the electrical connection thereof to respective ones of the pads 42 of the corresponding second set. Advantageously, the surface tension of the molten solder self-aligns the conductive contacts 68 to the pads 42 of the corresponding second set. During this particular procedure, it is contemplated that a vacuum stage or other mechanism will be included in the heated stage to keep the strip 88 flat during the operation. It is also preferable that the reflow be completed in a reducing atmosphere such as forming gas which is about 90% nitrogen and about 10% hydrogen. This atmosphere allows for minimal amounts of flux which is desirable for the underfill operation which will be described below.

Figure 11:
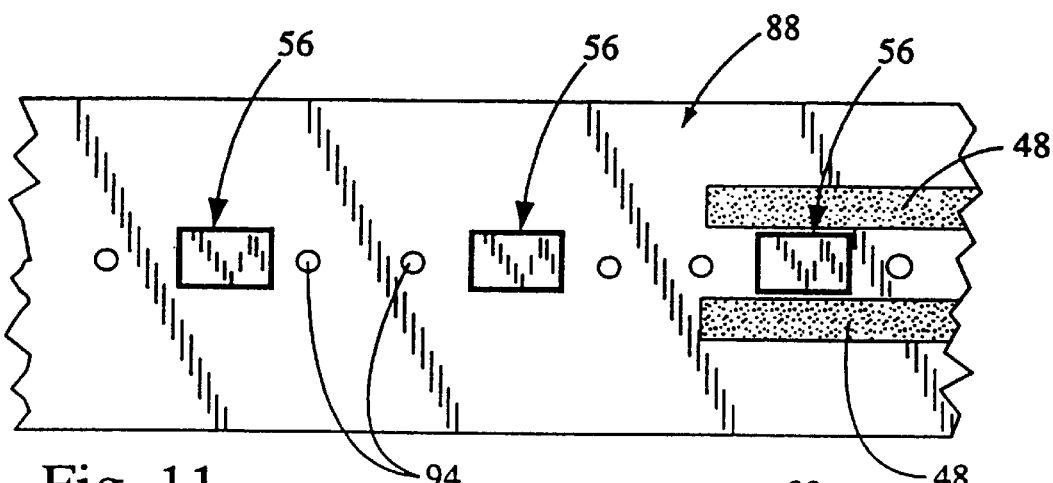

Referring now to FIG. 11, subsequent to the reflow of the solder, the strip 88 having the integrated circuit chip 56 electrically connected thereto, is placed upon a heated stage, the temperature of which is set to about 90 degrees Celsius. Thereafter, the underfill epoxy is dispensed along one longitudinal side 64 of the body 58 of the integrated circuit chip 56 to wick under the body 58. As a result of such wicking, the epoxy underfill flows between the bottom surface 62 of the body 58 and the top surface of the strip 88. The heat generated by the stage is then preferably increased to about 160 degrees Celsius for about five minutes to cure (i.e., gel or harden) the underfill epoxy. It is also preferred that a vacuum hold-down as described above be included in this particular stage to maintain the strip 88 in a substantially flat orientation during the cure of the underfill epoxy. As will be recognized, this epoxy, when cured, is the epoxy layer 70 described above in relation to the chip package 22. It will be recognized that the epoxy may also be applied along both of the longitudinal sides 64 of the body 58 during this stage.

Subsequent to the completion of the underfill epoxy stage, the integrity of the electrical connection (i.e., soldered connections) between the integrated circuit chip 56 and the corresponding conductive pattern 36 is tested. The testing is preferably completed through the use of test probes which are electrically connected to respective ones of the traces 40 on the bottom surface of the strip 88. It is contemplated that each of the traces 40 may extend to a testing pad which will be removed from the flex circuit 24 upon the completion of the assembly method related to the chip package 22. These test pads can be provided with equal diameters and spacing to allow for the use of a universal probe system for different chip package sizes.

As is further seen in FIG. 11, subsequent to the completion of the initial electrical test, the above-described adhesive strips 48 are bonded to the top surface of the strip 88 along opposite sides (i.e., the longitudinal sides 64) of the body 58 of the integrated circuit chip 56. The adhesive strips 48 extend in spaced, generally parallel in relation to each other, and in generally parallel relation to the longitudinal sides 64 of the body 58. The adhesive strips 48 are adhered or mated to the top surface of the strip 88, with the assembly thereafter being heated to about 140 degrees Celsius. Pressure is also applied for approximately five to ten seconds to the adhesive strips 48, with the combined adhesive strips 48 and strip 88 then being allowed to cool down before a paper backing is removed from the exposed sides of the adhesive strips 48.

Figure 12:
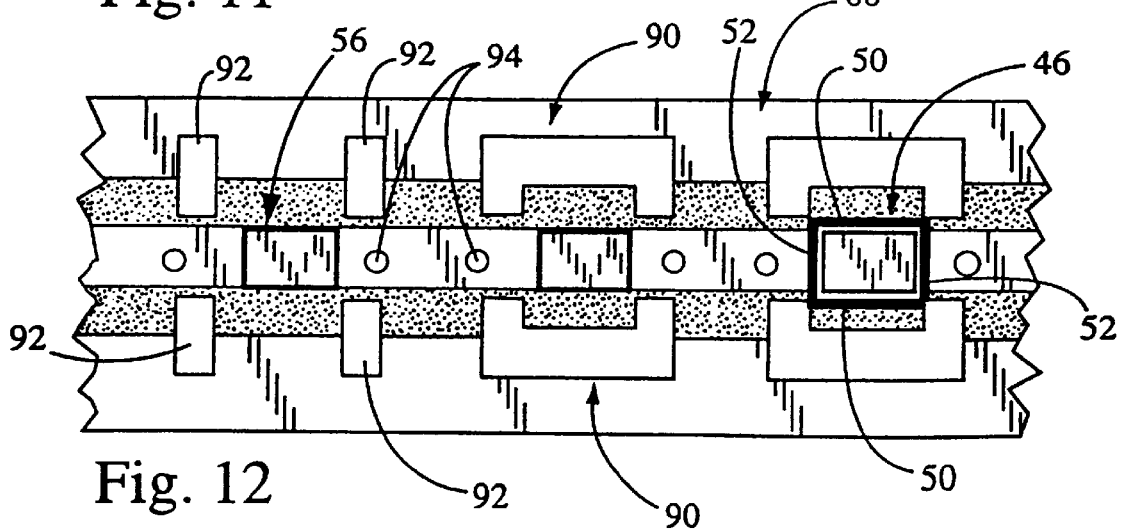

Referring now to FIG. 12, subsequent to the bonding of the adhesive strips 48 to the strip 88, a flex window 90 is punched into the strip 88. The punching operation preferably occurs in two steps, with the first step resulting in the formation of four rectangularly configured openings 92 which each extend through portions of the adhesive strips 48 and portions of the strip 88. As seen in FIG. 12, each of the openings 92 is disposed outwardly beyond a respective lateral side 66 of the body 58 of the corresponding integrated circuit chip 56. In the second step of the punching operation, the openings 92 extending through a common adhesive strip 48 are connected by the removal of a small portion of the common adhesive strip 48 and a large portion of the strip 88. The resultant flex window 90 has a generally U-shaped configuration. In the present method, a universal pattern for the flex window 90 can be adopted to work with an integrated circuit chip 56 of any size.

Upon the completion of the punching operation, the strip 88 is registered to a frame locating fixture via registration holes 94 formed within the strip 88. As is seen in FIGS. 10–13, a pair of registration holes 94 is disposed within the strip 88 between each adjacent pair of the second sets of conductive pads 28, and hence between each adjacent pair of integrated circuit chips 56. The integrated circuit chips 56 and registration holes 94 are disposed in linear alignment along the approximate center of the strip 88. Once the strip 88 has been registered on the frame locating fixture via the registration holes 94, the frame 46 is dropped into position and bonded to the adhesive strips 48 at a temperature of about 140 degrees Celsius for about five seconds and at a pressure of about 20 psi. As is shown in FIG. 12, the properly positioned frame 46 circumvents and is equidistantly spaced from the longitudinal and lateral sides 64, 66 of the body 58 of the corresponding integrated circuit chip 56.

Figure 13:
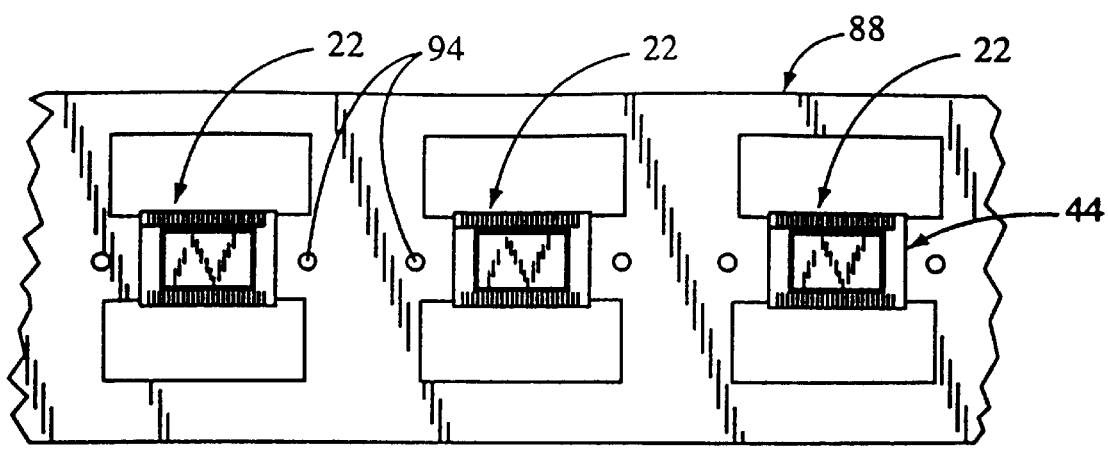

Referring now to FIG. 13, subsequent to the attachment of the frame 46 to the strip 88, those portions of the adhesive strips 48 and strip 88 protruding beyond the longitudinal sides 50 of the frame 46 are wrapped thereabout. As seen in FIGS. 16(a)–16(e), such wrapping is accomplished by the advancement of the strip 88 over a spaced pair of reciprocally moveable wrapping fingers 96. Downward pressure is applied to at least one of the frame 46 and the body 58 of the integrated circuit chip 56 to force both the frame 46 and the integrated circuit chip 56 between the wrapping fingers 96 and facilitate the folding of the strip 88 and adhesive strips 48 upwardly along each of the longitudinal sides 50 of the frame 46. The wrapping fingers 96 are then moved inwardly toward each other in the manner shown in FIG. 16(d) to facilitate the wrapping of the adhesive strips 48 and strip 88 about the longitudinal sides 50 of the frame 46. The wrapping fingers 96 are preferably maintained in the orientation shown in FIG. 16(d) for a period of about five minutes, with the temperature being raised to about 180 degrees Celsius. This elevated temperature for the five minute duration facilitates the complete curing of the adhesive strips 48. Upon the elapse of such time, the wrapping fingers 96 are moved away from each other in the manner shown in FIG. 16(e). For purposes of clarity, the adhesive strips 48 are shown only in FIG. 16(a) and are not shown in FIGS. 16(b)–16(e).

Figure 14:
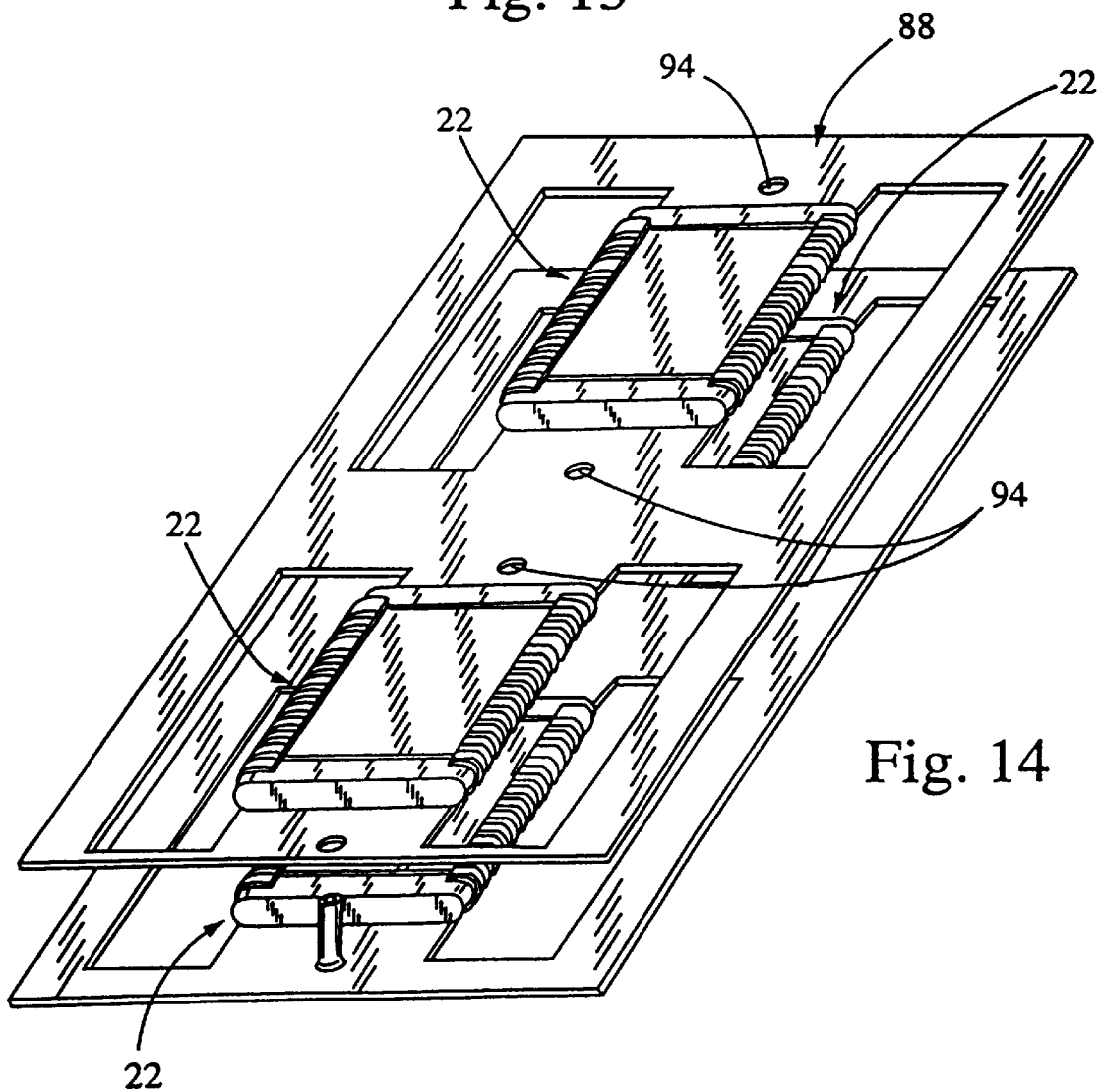
Figure 15:
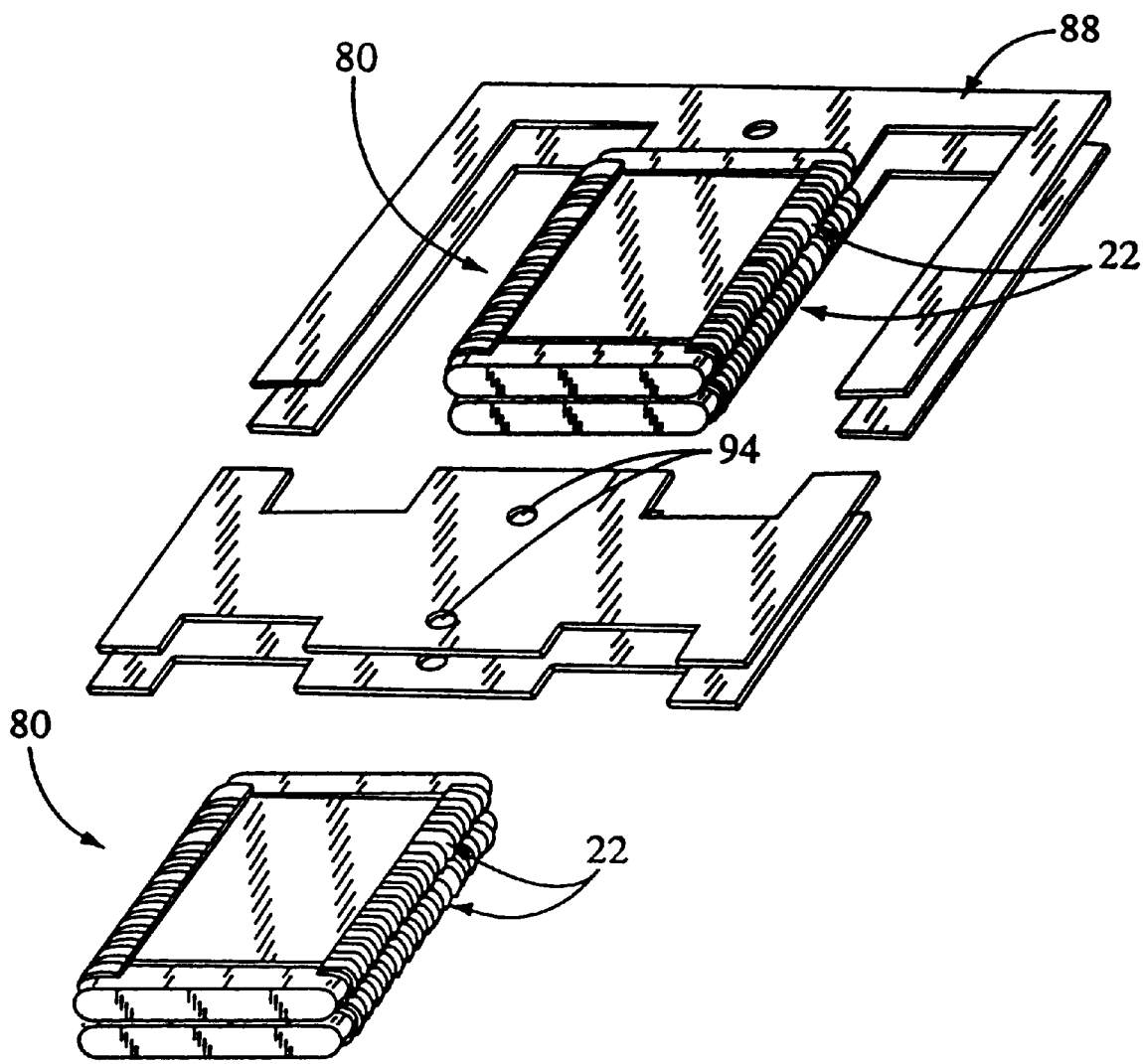
Figure 16:
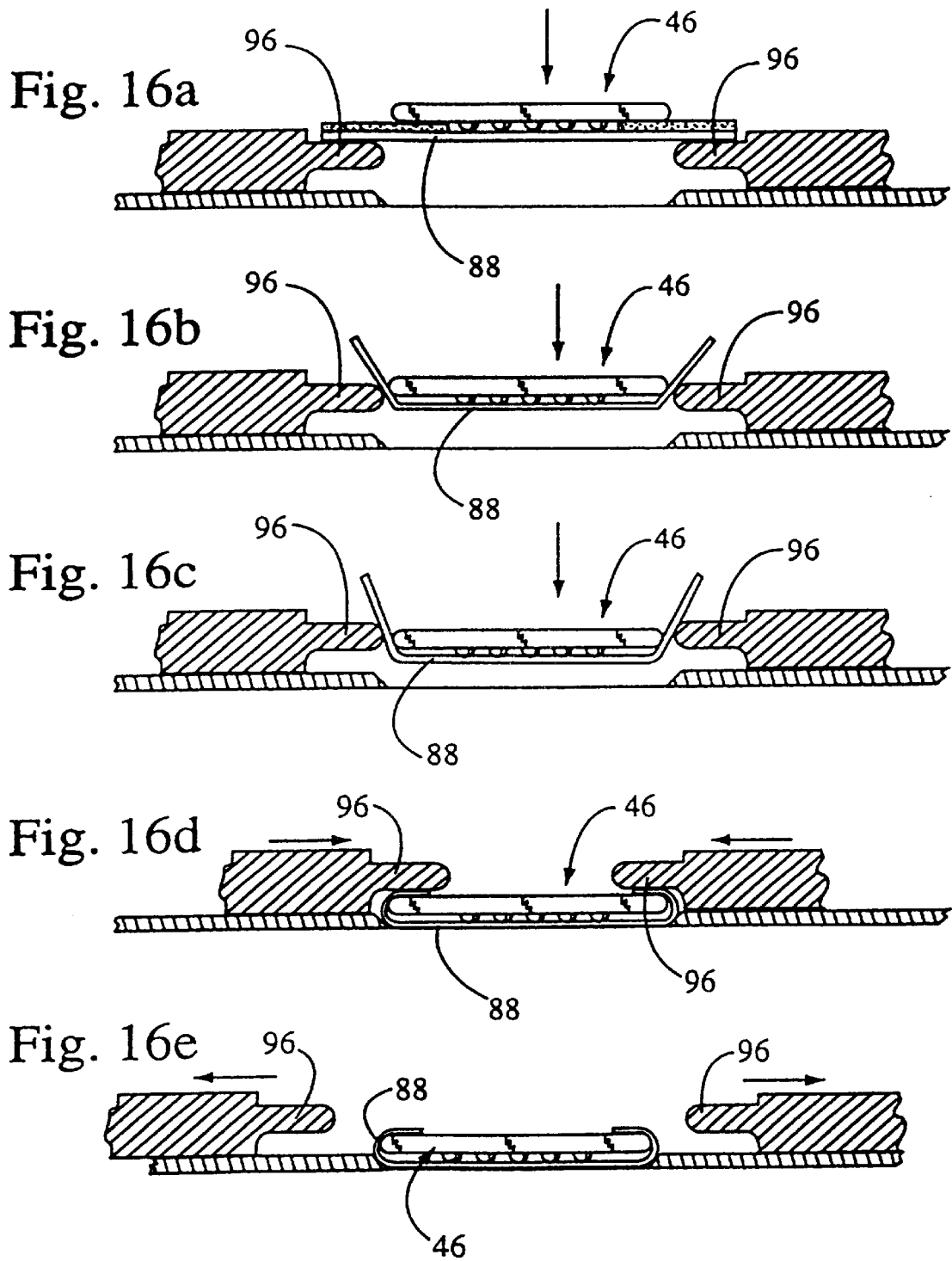
FIGS. 16a–16e illustrate the step-by-step sequence included in the assembly step shown in FIG. 13.

Referring now to FIG. 14, subsequent to the completion of the wrapping procedure, two continuous strips 88 containing the completed chip packages 22 are brought together and registered using the registration holes 94 within the strips 88. The Z-axis film 84 described above is then cut into rectangles and positioned between each pair of vertically aligned chip packages 22 in the above-described manner. Heat and pressure are then applied to each chip stack 80 for approximately one minute to cure the Z-axis film 84. Upon the cure of the Z-axis film 84, the chip stacks 80 are separated from the remainder of the strip 88. Thereafter, the copper or solder bumps 78 may be formed on the first set of conductive pads 38 of the lowermost chip package 22 within each chip stack 80. This particular step is omitted if the lowermost strip 88 is originally provided with the copper bumps 78 formed on the pads 38 of each of the first sets thereof. Finally, the completed chip stack 80 is subjected to an electrical test to verify the integrity of all the electrical connections therein. The copper or solder bumps 78 are preferably formed during the fabrication of the flex circuit 24 through the use of a plating process.

Figure 17:
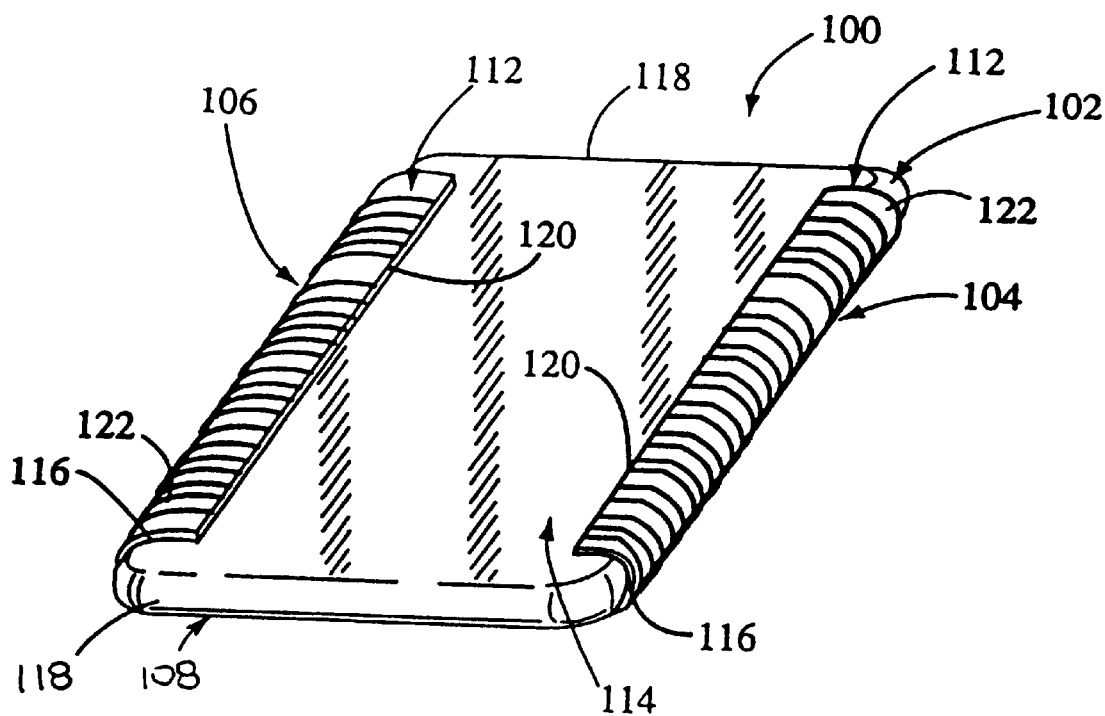
FIG. 17 is a top perspective view of a two-sided flex circuit chip package constructed in accordance with a second embodiment of the present invention.
Figure 18:
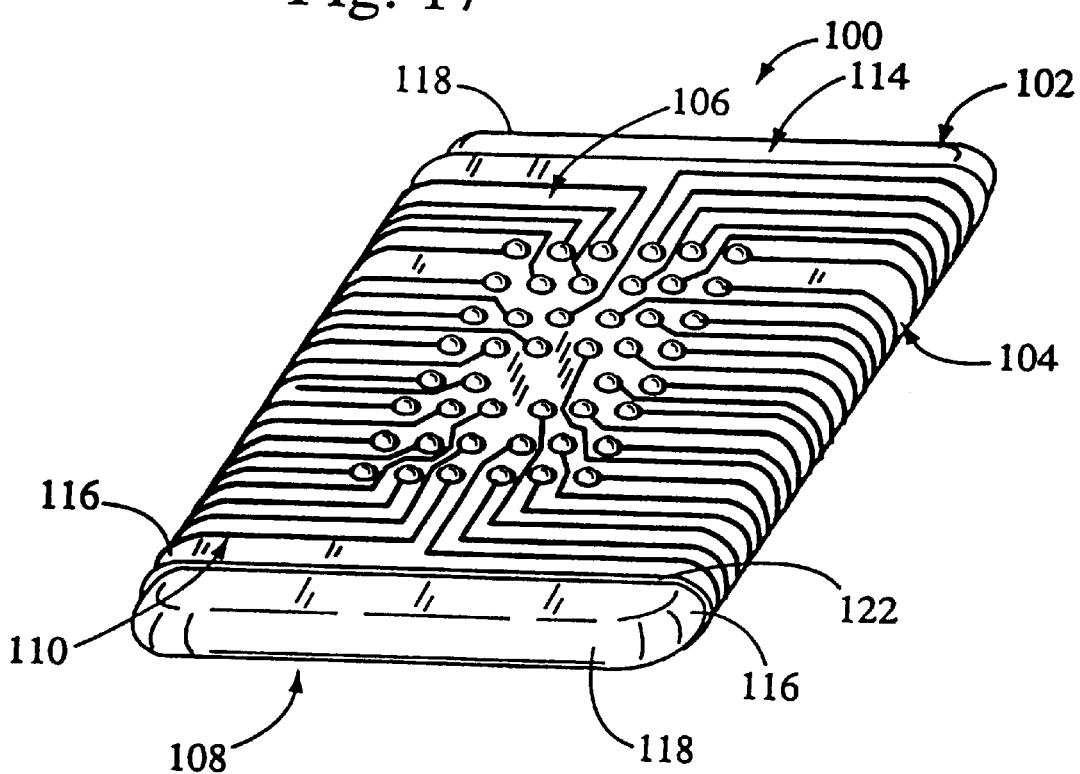
FIG. 18 is a bottom perspective view of the chip package of the second embodiment shown in FIG. 17.
Figure 19:
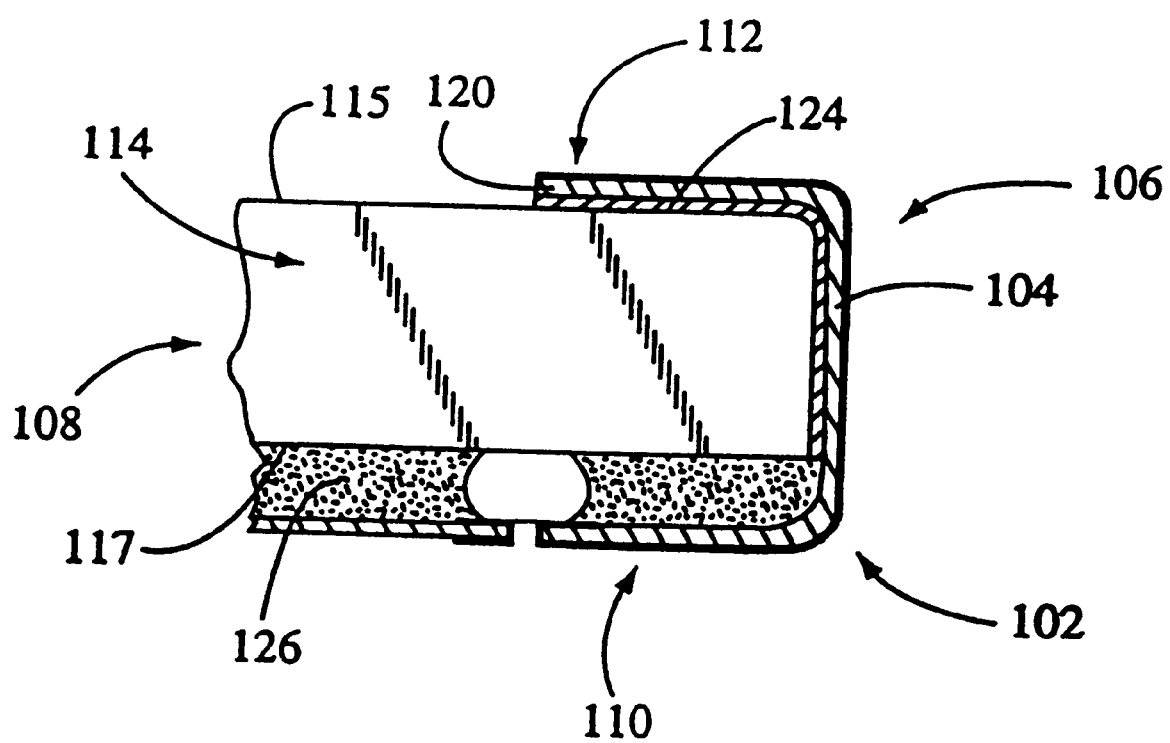
FIG. 19 is a partial cross-sectional view of the chip package of the second embodiment shown in FIG. 17.

Referring now to FIGS. 17–19, there is depicted a stackable integrated circuit chip package 100 constructed in accordance with a second embodiment of the present invention. The chip package 100 comprises a flex circuit 102 which is substantially identical to the previously described flex circuit 24, and comprises a flexible substrate 104 having a conductive pattern 106 disposed thereon. The chip package 100 also includes an integrated circuit chip 108 which is identical to the above-describe integrated circuit chip 56 and is electrically connected to the conductive pattern 106. The substrate 104 of the chip package 100 is wrapped about and attached to at least a portion of the integrated circuit chip 108 such that the conductive pattern 106 defines a first portion 110 and a second portion 112 which are each electrically connectable to another stackable integrated circuit chip package. In the chip package. 100 of the second embodiment, the conductive pattern 106 is substantially identical to the conductive pattern 36 previously described in relation to the chip package 22. Additionally, the electrical connection of the integrated circuit chip 108 to the conductive pattern 106 is accomplished in the chip package 100 in the same manner previously described in relation to the electrical connection of the integrated circuit chip 56 to the conductive pattern 36.

In the chip package 100 of the second embodiment, the body 114 of the integrated circuit chip 108 preferably has a general rectangular configuration defining a pair of longitudinal sides 116 and a pair of lateral sides 118. The substrate 104 itself preferably has a generally rectangular configuration defining a pair of longitudinal peripheral edge segments 120 and a pair of lateral peripheral edge segments 122. The conductive pattern 106 extends along the bottom surface of the substrate 104 to the longitudinal peripheral edge segments 120 thereof. The substrate 104 is wrapped about the longitudinal sides 116 of the body 114, such that the longitudinal peripheral edge segments 120 extend along the top surface 115 of the body 114 in spaced, generally parallel relation to each other. The first and second portions 110, 112 of the conductive pattern 106 also extend in spaced, generally parallel relation to each other, with the first portion 110 extending over portions of the bottom surface 117 of the body 114 and the second portion 112 extending over a portion of the top surface 115 of the body 114. The substrate 104 is preferably attached to the body 114 of the integrated circuit chip 108 through the use of a pair of adhesive strips 124 substantially identical to the above-described adhesive strips 48. Additionally, an epoxy layer 126 substantially identical to the above-described epoxy layer 70 is preferably disposed between the bottom surface 117 of the body 108 and the top surface of the substrate 104.

The assembly process or method related to the chip package 100 of the second embodiment is substantially similar to the assembly method previously described in relation to the chip package 22 of the first embodiments. In this respect, the assembly method related to the chip package 100 differs primarily in that the strip 88 is wrapped about the opposed longitudinal sides 116 of the body 114 and adhered directly thereto due to the absence of the frame 46 in the chip package 100 of the second embodiment.

Figure 20:
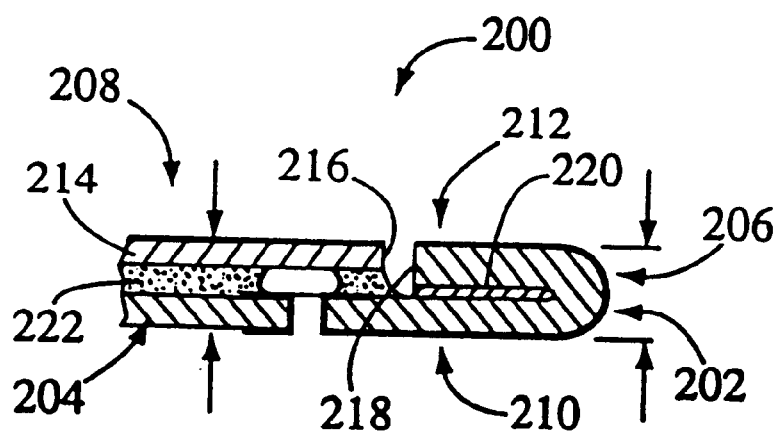
FIG. 20 is a partial cross-sectional view of a two-sided flex circuit chip package constructed in accordance with a third embodiment of the present invention.

Referring now to FIG. 20, there is depicted a stackable integrated circuit chip package 200 constructed in accordance with a third embodiment of the present invention. The chip package 200 comprises a flex circuit 202 which itself comprises a flexible substrate 204 having opposed, generally planar top and bottom surfaces, and a conductive pattern 206 disposed thereon. The chip package 200 of the third embodiment further comprises an integrated circuit chip 208 which is electrically connected to the conductive pattern 206. The substrate 204 is folded and attached to itself such that the conductive pattern 206 defines a first portion 210 and a second portion 212 which are each electrically connectable to another stackable integrated circuit chip package. In the chip package 200 of the third embodiment, the conductive pattern 206 is substantially identical to the above-described conductive pattern 36 of the chip package 22. Additionally, the electrical connection of the integrated circuit chip 208 (which is substantially identical to the above-described integrated circuit chip 56) to the conductive pattern 206 is accomplished in the same manner previously described in relation to the electrical connection of the integrated circuit chip 56 to the conductive pattern 36 in the chip package 22.

In the chip package 200 of the third embodiment, the body 214 of the integrated circuit chip 208 preferably has a generally rectangular configuration defining a pair of longitudinal sides 216 and a pair of lateral sides. The substrate 204 itself preferably has a generally rectangular configuration defining a pair of longitudinal peripheral edge segments 218 and a pair of lateral peripheral edge segments. The conductive pattern 206 extends along the bottom surface of the substrate 204 to the longitudinal peripheral edge segments 218 thereof. The substrate 204 is folded such that the longitudinal peripheral edge segments 218 thereof extend along and in substantially parallel relation to respective ones of the longitudinal sides 216 of the body 214, with the first and second portions 210, 212 of the conductive pattern 206 extending in generally parallel relation to each other.

As seen in FIG. 20, the total thickness of the substrate 204 at those regions whereat it is folded over itself is preferably such that the second portion 212 of the conductive pattern 206 is substantially flush with or extends along a plane disposed above the top surface of the body 214 of the integrated circuit chip 208, thus allowing for the electrical connection of the second portion 212 to another stackable integrated circuit chip package. In the chip package 200 of the third embodiment, the substrate 204 is preferably attached to itself through the use of a pair of adhesive strips 220 substantially similar to the above-described adhesive strips 48 of the chip package 22 of the first embodiment. The chip package 200 of the third embodiment further preferably comprises an epoxy layer 222 which is disposed between the bottom surface of the body 214 and the top surface of the substrate 204, and is substantially identical to the above-described epoxy layer 70 of the chip package 22 of the first embodiment. The assembly method related to the chip package 200 of the third embodiment is also substantially analogous to the above-described assembly method related to the chip package 22 of the first embodiment, except that the substrate 204 is folder over and adhered to itself rather than to either the frame 46 or the body 214 of the integrated circuit chip 208.

Additional modifications and improvements of the present invention may also be apparent to those of ordinary skill in the art. Thus, the particular combination of parts and steps described and illustrated herein is intended to represent only certain embodiments of the present invention, and is not intended to serve as limitations or alternative devices and methods within the spirit and scope of the invention.

What is claimed is:

1. A method of assembling a stackable integrated circuit chip package, comprising the steps of:
   (a) electrically connecting an integrated circuit chip to a conductive pattern on a flexible substrate of a flex circuit;
   (b) attaching a frame to the flex circuit such that the frame at least partially circumvents the integrated circuit chip; and
   (c) wrapping the flex circuit about and securing the flex circuit to at least a portion of the frame such that the conductive pattern defines first and second portions which are each electrically connectable to at least one other stackable integrated circuit chip package.

2. The method of claim 1 wherein the integrated circuit chip includes a plurality of conductive contacts having solder applied thereto, and step (a) comprises the steps of:
   (1) applying a layer of flux to the conductive contacts of the integrated circuit chip;
   (2) positioning the integrated circuit chip upon the substrate such that at least some of the conductive contacts abut the conductive pattern; and
   (3) applying heat to the integrated circuit chip and the substrate to facilitate the reflow of the solder and electrical connection of the conductive contacts to the conductive pattern.

3. The method of claim 2 wherein step (3) is completed at a temperature not exceeding about 220 degrees Celsius and in a reducing atmosphere of about 90 percent nitrogen and about 10 percent hydrogen.

4. The method of claim 3 wherein step (3) is completed while a vacuum is being applied to the substrate to maintain the substrate in a generally flat orientation.

5. The method of claim 2 wherein step (a) further comprises the steps of:
   (4) dispensing a quantity of an epoxy onto the substrate along a side of the integrated circuit chip to facilitate the wicking of the epoxy between the integrated circuit chip and the substrate; and
   (5) applying heat to the integrated circuit chip and the substrate to facilitate the hardening of the epoxy.

6. The method of claim 5 wherein:
   step (4) is completed when the substrate is placed on a heated stage at a temperature of about 90 degrees Celsius; and
   step (5) is completed on the heated stage at a temperature of about 160 degrees Celsius for a time period of about 5 minutes.

7. The method of claim 6 wherein steps (4) and (5) are completed while a vacuum is being applied to the substrate to maintain the substrate in a generally in flat orientation.

8. The method of claim 5 wherein step (a) further comprises the step of:
   (6) testing the integrity of the electrical connection of the conductive contacts of the integrated circuit chip to the conductive pattern.

9. The method of claim 1 wherein step (b) comprises the steps of:

(1) bonding two strips of an adhesive to the substrate along opposite sides of the integrated circuit chip;

(2) punching a pair of flex windows through the substrate and respective ones of the adhesive strips; and (3) attaching the frame to the adhesive strips.

10. The method of claim 9 wherein step (1) is completed by heating the adhesive strips and the substrate to a temperature of about 140 degrees Celsius and applying pressure to the adhesive strips for a time period of from about 5 seconds to about 10 seconds.

11. The method of claim 9 wherein step (3) comprises heating the frame, the adhesive strips, and the substrate to a temperature of about 140 degrees Celsius and applying pressure of about 20 psi to the frame for a time period of about 5 seconds.

12. The method of claim 1 wherein the frame defines opposed sides, and step (c) comprises the steps of:

(1) positioning the substrate upon a spaced pair or reciprocally movable wrapping fingers;

(2) applying downward pressure to at least one of the frame and the integrated circuit chip to force the frame and the integrated circuit chip between the wrapping fingers and facilitate the folding of the substrate upwardly along each of the opposed sides of the frame;

(3) moving the wrapping fingers toward each other to facilitate the wrapping of the substrate about the opposed sides of the frame; and (4) moving the wrapping fingers away from each other to allow for the removal of the chip package from therebetween.

13. The method of claim 12 wherein step (3) comprises applying heat to the chip package at a temperature of about 180 degrees Celsius for a time period of about 5 minutes.

14. The method of claim 1 further comprising the step of:

(d) electrically connecting the second portion of the conductive pattern of the chip package to the first portion of the conductive pattern of another stackable integrated circuit chip package to form a chip stack.

15. The method of claim 14 wherein step (d) comprises the steps of:

(1) placing a Z-axis film between the chip packages; and (2) applying heat and pressure to the chip packages for a time period of about 1 minute to cure the Z-axis film.

16. The method of claim 14 further comprising the steps of:

(e) forming a plurality of copper bumps on the first portion of the conductive pattern of the lowermost chip package of the chip stack; and (f) testing the integrity of the electrical connection of the chip packages to each other.

17. A method of assembling a stackable integrated circuit chip package, comprising the steps of:

(a) electrically connecting an integrated circuit chip to a conductive pattern on a flexible substrate of a flex circuit;

(b) wrapping the flex circuit about and securing the flex circuit to at least a portion of the integrated circuit chip such that the conductive pattern defines first and second portions which are each electrically connectable to at least one other stackable integrated circuit chip package.

18. The method of claim 17 wherein the integrated circuit chip includes a plurality of conductive contacts having solder applied thereto, and step (a) comprises the steps of:

(1) applying a layer of flux to the conductive contacts of the integrated circuit chip;

(2) positioning the integrated circuit chip upon the substrate such that at least some of the conductive contacts abut the conductive pattern; and (3) applying heat to the integrated circuit chip and the substrate to facilitate the reflow of the solder and electrical connection of the conductive contacts to the conductive pattern.

19. The method of claim 18 wherein step (3) is completed at a temperature not exceeding about 220 degrees Celsius and in a reducing atmosphere of about 90 percent nitrogen and about 10 percent hydrogen.

20. The method of claim 19 wherein step (3) is completed while a vacuum is being applied to the substrate to maintain the substrate in a generally flat orientation.

21. The method of claim 18 wherein step (a) further comprises the steps of:

(4) dispensing a quantity of an epoxy onto the substrate along a side of the integrated circuit chip to facilitate the wicking of the epoxy between the integrated circuit chip and the substrate; and (5) applying heat to the integrated circuit chip and the substrate to facilitate the hardening of the epoxy.

22. The method of claim 21 wherein:

step (4) is completed when the substrate is placed on a heated stage at a temperature of about 90 degrees Celsius; and step (5) is completed on the heated stage at a temperature of about 160 degrees Celsius for a time period of about 5 minutes.

23. The method of claim 22 wherein steps (4) and (5) are completed while a vacuum is being applied to the substrate to maintain the substrate in a generally in flat orientation.

24. The method of claim 21 wherein step (a) further comprises the step of:

(6) testing the integrity of the electrical connection of the conductive contacts of the integrated circuit chip to the conductive pattern.

25. The method of claim 17 wherein the integrated circuit chip defines opposed sides, and step (b) comprises the steps of:

(1) positioning the substrate upon a spaced pair or reciprocally movable wrapping fingers;

(2) applying downward pressure to the integrated circuit chip to force the integrated circuit chip between the wrapping fingers and facilitate the folding of the substrate upwardly along each of the opposed sides of the integrated circuit chip;

(3) moving the wrapping fingers toward each other to facilitate the wrapping of the substrate about the opposed sides of the integrated circuit chip; and (4) moving the wrapping fingers away from each other to allow for the removal of the chip package from therebetween.

26. The method of claim 25 wherein step (3) comprises applying heat to the chip package at a temperature of about 180 degrees Celsius for a time period of about 5 minutes.

27. The method of claim 17 further comprising the step of:

(c) electrically connecting the second portion of the conductive pattern of the chip package to the first portion of the conductive pattern of another stackable integrated circuit chip package to form a chip stack.

28. The method of claim 27 wherein step (c) comprises the steps of:

(1) placing a Z-axis film between the chip packages; and (2) applying heat and pressure to the chip packages for a time period of about 1 minute to cure the Z-axis film.

29. The method of claim 27 further comprising the steps of:
   (d) forming a plurality of copper bumps on the first portion of the conductive pattern of the lowermost chip package of the chip stack; and
   (e) testing the integrity of the electrical connection of the chip packages to each other.

30. A method of assembling a stackable integrated circuit chip package, comprising the steps of:
   (a) electrically connecting an integrated circuit chip to a conductive pattern on a flexible substrate of a flex circuit;
   (b) folding the flex circuit over and securing it to a portion of itself such that the conductive pattern defines first and second portions which are each electrically connectable to at least one other stackable integrated circuit chip package.

* * * * *